United States Patent [19]
Baker et al.

[11] Patent Number: 5,207,862
[45] Date of Patent: May 4, 1993

[54] TECHNIQUE FOR EPITAXIAL GROWTH OF ORIENTED THIN FILMS OF POLYDIACETYLENES

[75] Inventors: Gregory L. Baker, Tinton Falls; Sin-Doo Lee, Eatontown; Jayantilal S. Patel, Middletown, all of N.J.

[73] Assignee: Bell Communications Research, Inc., Livingston, N.J.

[21] Appl. No.: 404,888

[22] Filed: Sep. 8, 1989

[51] Int. Cl.$^5$ .............................................. C30B 29/54
[52] U.S. Cl. .................................. 156/600; 156/603; 156/DIG. 73; 156/DIG. 113; 385/130; 385/141
[58] Field of Search ............... 156/600, 603, DIG. 73, 156/DIG. 113; 427/355; 350/96.12, 96.34

[56] References Cited

U.S. PATENT DOCUMENTS

| | | | |
|---|---|---|---|
| 3,839,067 | 10/1974 | Sosnowski et al. | 350/96.12 |
| 4,238,352 | 12/1980 | Patel | 430/541 |
| 4,431,263 | 2/1984 | Garito | 264/1.4 |
| 4,531,809 | 7/1985 | Carter et al. | 350/96.12 |
| 4,561,726 | 12/1985 | Goodby et al. | 350/341 |
| 4,743,659 | 5/1988 | Sandman et al. | 525/356 |
| 4,767,169 | 8/1988 | Teng et al. | 350/96.12 |
| 4,787,714 | 11/1988 | Greene et al. | 350/96.13 |
| 4,789,622 | 12/1988 | Leyrer et al. | 430/283 |
| 4,808,285 | 2/1989 | Chen et al. | 156/643 |
| 4,824,522 | 4/1989 | Baker et al. | 350/96.12 |
| 4,834,480 | 5/1989 | Baker et al. | 350/96.12 |
| 4,863,763 | 9/1989 | Takeda et al. | 427/355 |

FOREIGN PATENT DOCUMENTS 60-208707  10/1985  Japan ................................ 350/96.12

*Primary Examiner*—Robert Kunemund
*Attorney, Agent, or Firm*—Leonard Charles Suchyta; Lionel N. White

[57] ABSTRACT

A technique for the preparation of an oriented thin film polydiacetylene suitable for use in channel waveguides involves depositing an alignment polymer upon a substrate, rubbing the surface thereof to effect orientation, depositing the polydiacetylene thereon and heating to a temperature just below the melting point thereof.

10 Claims, 1 Drawing Sheet

FIG.
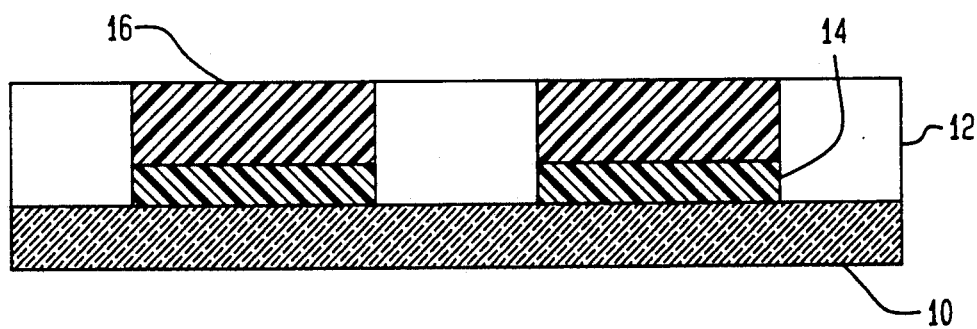

TECHNIQUE FOR EPITAXIAL GROWTH OF ORIENTED THIN FILMS OF POLYDIACETYLENES

FIELD OF THE INVENTION

This invention relates to a technique for orienting thin film polydiacetylenes. More particularly, the present invention relates to a method for orienting thin film polydiacetylenes deposited upon an alignment polymer.

Heretofore, considerable interest has been generated in the use of organic materials for optical elements such as optical waveguides for applications in nonlinear optics. Among such polymers are the conjugated polymers such as the polyacetylenes and polydiacetylenes. These materials evidence large optical nonlinearities and ultrafast response times, so suggesting their use in nonlinear optics.

These conjugated polymers are generally optically isotropic due to the random orientation of crystallites or the formation of an amorphous structure. Although the optically isotropic state has been found advantageous because scattering of light is minimized, some of the nonlinear optical properties are lost because of the misorientation of polymer chains with respect to the electric field of the incident light. Accordingly, it is necessary to orient the polymer chains to maximize the nonlinear optical response. Furthermore, orientation of the polymer chains affords the opportunity to form waveguide structures in conjugated polymer films by exploiting the change in the refractive index which accompanies chain ordering.

Heretofore, various alignment techniques have been used to produce partial orientation, as for example, in the case of polydiacetylene poly[5,7-dodecadiyne-1,12-diol bis (n-butoxycarbonylmethylurethane), commonly termed [poly(4 BCMU)]. Rubbing the surface of cast films of this material resulted in some chain orientation and an optical anisotropy of approximately 4 at the maximum of the optical absorption. However, alignment quality was found to be poor. More recently, workers in the art reported that oriented crystalline films were obtained by evaporating 4 BCMU monomer upon a thin layer of rubbed poly(4 BCMU) followed by polymerization of the monomer. Unfortunately, this technique is cumbersome and yields films of marginal quality.

In accordance with the present invention, a novel technique is described for the epitaxial growth of poly(4 BCMU) upon thin layers of oriented alignment polymers. In brief, the inventive technique involves depositing an alignment polymer upon a suitable substrate and rubbing the surface of the polymer so as to induce orientation therein by conventional techniques such as by rubbing with a cloth or by means of a cloth covered wheel. Following, a soluble film of the polymer of interest is deposited upon the alignment polymer, so resulting in orientation in the deposited polymer film. Lastly, the resultant assembly is heated to a temperature above the glass transition temperature of the polymer of interest and then cooled to room temperature. Selective removal of the aligning polymer by conventional photolithographic techniques results in well-oriented films suitable for channel waveguide applications.

BRIEF DESCRIPTION OF THE FIGURE

The invention will be more readily understood by reference to the following detailed description taken in conjunction with the accompanying drawing wherein:

The FIGURE is a front elevational view, in cross section of a waveguide of the invention.

DETAILED DESCRIPTION

In the practice of the present invention, the first step involves selection of a suitable substrate which may be a glass substrate. Next, an alignment polymer is deposited upon the surface of the glass substrate by conventional techniques, such as by spin casting, in a thickness of at least 100 Å. Polymers suitable for this purpose may be selected from among linear polymers such as polyesters, polyamides and polyethylenes which when elongated retain a percentage of elongation (at break) greater than 100 percent. Suitable materials for this purpose are described in U.S. Pat. No. 4,561,726 issued to Goodby et al on Dec. 31, 1985. Then, the alignment layer is rubbed so as to induce orientation therein by conventional techniques such as by rubbing with a polyester or nylon cloth or by means of a cloth covered wheel. The thin unidirectionally rubbed polymer layer exhibits weak birefringence, so indicating an ordered arrangement of polymer chains. This step is found critical since, in the absence of rubbing the surface of the aligning polymer, orientation will not occur in the upper layer subsequently deposited. It may also be desirable to selectively rub the surface of the alignment polymer to produce a desired waveguide pattern. Thus, the alignment polymer may be selectively patterned using a photoresist, thereby leaving exposed areas which are subsequently rubbed in the described manner. Upon removal of the photoresist, the substrate will evidence a region of aligned polymer and a region of unaligned polymer suitable for use in waveguides. This procedure may also be used in preparing a grating structure for waveguide applications.

Following, a soluble conjugated polymer selected from among the soluble polydiacetylenes is deposited upon the alignment layer. These polydiacetylenes are linear polymers having an alternating pattern composed of single, triple, single, and double bonds in the main chain. They are prepared from diacetylene monomers by a solid state topotactic photopolymerization process. In general, this layer may comprise any polydiacetylene material which can be deposited upon a substrate. Suitable polydiacetylenes for this purpose are of the general formula

$$=[C(R)-C\equiv C-C(R')]=$$

wherein R and R' represents $C_1$–$C_{50}$ aliphatic groups, aromatic groups or combinations thereof with or without heteroatoms, and wherein R and R' may be the same or different. Specific soluble polydiacetylenes for the practice of the present invention include poly(3 BCMU), poly(4 BCMU), poly(TS 12) and the like.

The polydiacetylene may be deposited upon the alignment polymer by conventional techniques, as for example, by spin coating, in a thickness ranging up to about 2 microns. Then, the resultant assembly is heated to a temperature above the glass transition temperature and the polydiacetylene and close to the melting point so as to attain maximum chain mobility. Heating is continued for a period of time which is dictated by considerations of the ease or reorienting the polymer and the degree of polymer degradation. A waveguide prepared in accordance with the invention is shown in the FIGURE. Shown in a substrate 10 having deposited thereon selectively successive layers of an alignment polymer 14 and an oriented polydiacetylene 16. Unaligned polydiacetylene, 12, is also shown.

The invention will be more fully understood by reference to the following specific embodiment.

A 300 Å thick layer of poly(1,4-butylene terephthalate) was deposited by spin casting from a 1:1 mixture of o-chlorophenol and tetrachlorethane on a glass substrate. The resultant layer was then rubbed using a polyester wheel and selected areas of the film removed by standard photolithographic techniques. Then, a film of [poly(4 BCMU)] was deposited in a thickness of approximately 0.5 microns. This end was attained by dissolving the poly(4 BCMU) having a molecular weight of about 300,000 in cyclopentanone and spin coating the solution at 3,000 rpm for 45 seconds. Following, the deposited film was dried in a vacuum at 40° C. to remove residual solvent and then thermally cycled to enhance the orientational order of the poly(4 BCMU) chains at a temperature above the glass transition temperature of the film but just below the melting point at 140° C. for a time period of 15 seconds. The film so treated evidenced a high degree of ordering.

The orientational order of poly(4 BCMU) films was measured by monitoring the modulation of the transmitted light intensity as a function of the rotation angle of the sample under cross polarizers. Quantitatively, the degree of orientational order was determined by measuring the birefringence of the sample. The residual birefringence from the underlying PBT alignment layer was found to be very small so that for practical purposes it was assumed to be negligible. Without rubbing, no alignment of the poly(4 BCMU) film was observed. The orientational order ($\propto \Delta n$) of the poly(4 BCMU) films showed only a weak dependence on film thickness for samples of 1000 Å to 8000 Å in thickness. It was also determined that once a well-aligned layer of PBT was obtained, its ability to orient poly(4 BCMU) remained stable at 140° C. for several hours, so ensuring that the observed change in optical anisotropy induced by epitaxy at elevated temperatures results from net changes in the orientational order of poly(4 BCMU) chains.

Measured values of birefringence of the deposited films were 0.14±0.01, so enabling the formation of gratings and channel waveguides on patterned surfaces.

While the invention has been described in detail in the foregoing specification and in the exemplary embodiment, it will be appreciated that such was solely for purposes of exposition and not by way of limitation, variations therefrom being within the spirit and scope of the invention.

What is claimed is:

1. Method for the preparation of an oriented thin film polydiacetylene upon a substrate which comprises the steps of:
    (a) depositing a thin film of an alignment layer upon said substrate,
    (b) rubbing the surface of the alignment layer with a cloth, thereby inducing orientation therein,
    (c) depositing a soluble film of a polydiacetylene upon the oriented alignment layer,
    (d) heating the resultant assembly to a temperature above the glass transition temperature but just below the melting point of the polydiacetylene, and
    (e) cooling the assembly to room temperature.

2. Method in accordance with claim 1 wherein the alignment layer is selected from the group consisting of polyester, polyamides and polyethylenes which when elongated retain a percentage of elongation (at break) greater than 100 percent.

3. Method in accordance with claim 1 wherein the polydiacetylene is of the general formula

$$=[C(R)-C\equiv C-C(R')]=$$

wherein R and R' represent $C_1$-$C_{50}$ aliphatic groups, aromatic groups or combinations thereof with or without heteroatoms and wherein R and R' may be the same or different.

4. Method in accordance with claim 1 wherein the alignment layer is deposited in a thickness of at lest 100 Å.

5. Method in accordance with claim 1 wherein said substrate is glass.

6. Method in accordance with claim 1 wherein said polydiacetylene is poly(4 BCMU).

7. Method in accordance with claim 1 wherein said rubbing is area selective.

8. Method in accordance with claim 6 wherein said alignment layer is poly(1,4 butylene terephthalate).

9. Channel waveguide including an oriented thin film polydiacetylene deposited upon an alignment polymer.

10. Waveguide in accordance with claim 8 wherein said polydiacetylene is poly(4 BCMU) and said alignment polymer is poly(1,4 butylene terephthalate).

* * * * *